(12) United States Patent
Kikuchi et al.

(10) Patent No.: US 12,342,452 B2
(45) Date of Patent: Jun. 24, 2025

(54) CIRCUIT BOARD AND ELECTRONIC DEVICE

(71) Applicant: Murata Manufacturing Co., Ltd., Nagaokakyo (JP)

(72) Inventors: Kosuke Kikuchi, Nagaokakyo (JP); Kosuke Nishio, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 286 days.

(21) Appl. No.: 18/098,811

(22) Filed: Jan. 19, 2023

(65) Prior Publication Data

US 2023/0156910 A1 May 18, 2023

Related U.S. Application Data

(63) Continuation of application No. PCT/JP2021/022052, filed on Jun. 10, 2021.

(30) Foreign Application Priority Data

Jul. 29, 2020 (JP) .................................. 2020-128597

(51) Int. Cl.
*H05K 1/02* (2006.01)
*H01P 3/08* (2006.01)
*H05K 1/05* (2006.01)

(52) U.S. Cl.
CPC ............. *H05K 1/0237* (2013.01); *H01P 3/08* (2013.01); *H05K 1/05* (2013.01); *H05K 2201/09209* (2013.01); *H05K 2201/10015* (2013.01)

(58) Field of Classification Search
None
See application file for complete search history.

(56) References Cited

U.S. PATENT DOCUMENTS 6,535,083 B1 * 3/2003 Hageman ................ H01P 1/207
333/210
11,792,926 B2 * 10/2023 Lee ...................... H05K 1/0215
361/679.01

(Continued)

FOREIGN PATENT DOCUMENTS

GB      2512982 A  * 10/2014  ................ H01P 3/08
JP      2006120996 A     5/2006
(Continued)

OTHER PUBLICATIONS

International Search Report in PCT/JP2021/022052, mailed Sep. 7, 2021, 3 pages.

(Continued)

*Primary Examiner* — Krystal Robinson
(74) *Attorney, Agent, or Firm* — Keating & Bennett, LLP (57) ABSTRACT

A circuit board includes a board body, a signal conductor, a power supply conductor, and a first reference conductor. The signal conductor is in the board body and a high frequency signal is transmitted through the signal conductor. The power supply conductor is in the board body and is connected to a power supply potential. The power supply conductor extends along at least a portion of the signal conductor. The first reference conductor is in the board body and is insulated from the signal conductor and the power supply conductor.

20 Claims, 8 Drawing Sheets

(56) References Cited

U.S. PATENT DOCUMENTS

| | | | |
|---|---|---|---|
| 2012/0133458 A1* | 5/2012 | Kato | H01P 3/08 |
| | | | 333/238 |
| 2013/0127560 A1* | 5/2013 | Kato | H03H 7/38 |
| | | | 333/12 |
| 2014/0003007 A1* | 1/2014 | Shiroki | H01B 7/08 |
| | | | 361/752 |
| 2014/0176254 A1* | 6/2014 | Iida | H01P 3/08 |
| | | | 333/33 |
| 2016/0156087 A1 | 6/2016 | Baba et al. | |
| 2017/0149111 A1 | 5/2017 | Yosui et al. | |
| 2020/0367362 A1* | 11/2020 | Kim | H05K 7/1427 |
| 2023/0380075 A1* | 11/2023 | Matsuda | H05K 1/181 |

FOREIGN PATENT DOCUMENTS

| | | | |
|---|---|---|---|
| JP | 2006324444 A | 11/2006 | |
| JP | 2007329282 A | 12/2007 | |
| JP | 2009100440 A | 5/2009 | |
| WO | 2015118791 A1 | 8/2015 | |
| WO | WO-2015182348 A1 * | 12/2015 | ............ H01P 1/2039 |
| WO | 2016163436 A1 | 10/2016 | |

OTHER PUBLICATIONS

Written Opinion in PCT/JP2021/022052, mailed Sep. 7, 2021, 4 pages.

* cited by examiner

CIRCUIT BOARD AND ELECTRONIC DEVICE

CROSS REFERENCE TO RELATED APPLICATIONS

This application claims the benefit of priority to Japanese Patent Application No. 2020-128597 filed on Jul. 29, 2020 and is a Continuation Application of PCT Application No. PCT/JP2021/022052 filed on Jun. 10, 2021. The entire contents of each application are hereby incorporated herein by reference.

BACKGROUND OF THE INVENTION

1. Field of the Invention

The present invention relates to a circuit board and an electronic device including a signal conductor and a power supply conductor.

2. Description of the Related Art

As an invention related to a conventional circuit board, for example, a power transmission line described in International Publication No. 2016/163436 is known. The power transmission line includes a signal conductor pattern, power transmission conductor patterns, a first reference conductor, and a second reference conductor, as shown in FIG. 13 of International Publication No. 2016/163436. The first reference conductor is arranged above the signal conductor pattern. The second reference conductor is arranged below the signal conductor pattern. With this configuration, the signal conductor pattern, the first reference conductor, and the second reference conductor have a stripline structure. The power transmission conductor patterns are arranged to the right of the signal conductor pattern. The power transmission conductor patterns are connected to the first reference conductor. With this configuration, the first reference conductor functions as a power supply line. As a result, reduction in an insertion loss of the power supply line is achieved in the power transmission line described in International Publication No. 2016/163436.

In the power transmission line described in International Publication No. 2016/163436, a power supply potential is connected to the first reference conductor. For this reason, noise may come into the first reference conductor. In this case, noise may affect a high frequency signal which transmitted through the signal conductor pattern.

SUMMARY OF THE INVENTION

Preferred embodiments of the present invention provide circuit boards and electronic devices that are each able to reduce or prevent noise from affecting a high frequency signal which is transmitted through a signal conductor.

A circuit board according to a preferred embodiment of the present invention includes a board body, a signal conductor in the board body and through which a high frequency signal is transmitted, a power supply conductor in the board body and connected to a power supply potential, the power supply conductor extending along at least a portion of the signal conductor, and a first reference conductor in the board body and insulated from the signal conductor and the power supply conductor.

Definition of terms in the present specification will be described below. Hereinafter, a first member to a third member each mean a member, element, portion, body, or the like included in a signal transmission line. In the present specification, portions of the first member are defined in the following manner unless otherwise specified. A front portion of the first member means a front half of the first member. A rear portion of the first member means a rear half of the first member. A left portion of the first member means a left half of the first member. A right portion of the first member means a right half of the first member. An upper portion of the first member means an upper half of the first member. A lower portion of the first member means a lower half of the first member. A front end of the first member means an end in a forward direction of the first member. A rear end of the first member means an end in a backward direction of the first member. A left end of the first member means an end in a leftward direction of the first member. A right end of the first member means an end in a rightward direction of the first member. An upper end of the first member means an end in an upward direction of the first member. A lower end of the first member means an end in a downward direction of the first member. A front end portion of the first member means the front end of the first member and its vicinity. A rear end portion of the first member means the rear end of the first member and its vicinity. A left end portion of the first member means the left end of the first member and its vicinity. A right end portion of the first member means the right end of the first member and its vicinity. An upper end portion of the first member means the upper end of the first member and its vicinity. A lower end portion of the first member means the lower end of the first member and its vicinity.

Circuit boards according to preferred embodiments of the present invention are each able to reduce or prevent noise from affecting a high frequency signal which is transmitted through a signal conductor.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred Embodiment

Structure of Circuit Board

Figure 1:
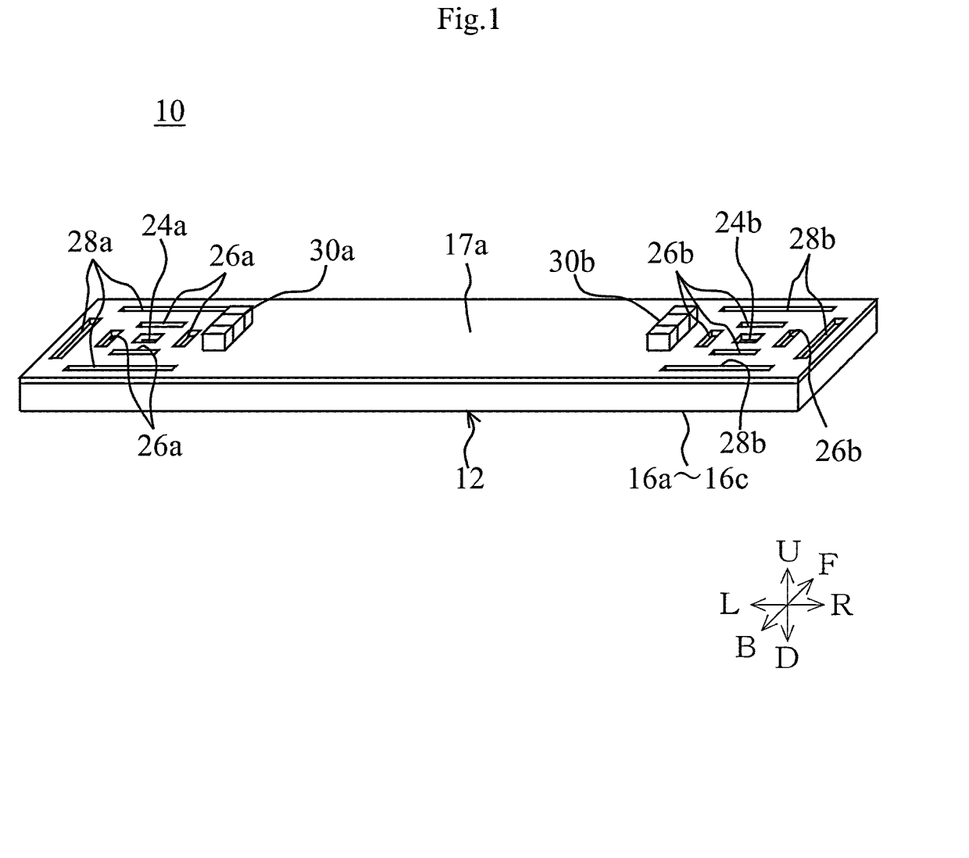
FIG. 1 an external perspective view of a circuit board 10 according to a preferred embodiment of the present invention.
Figure 2:
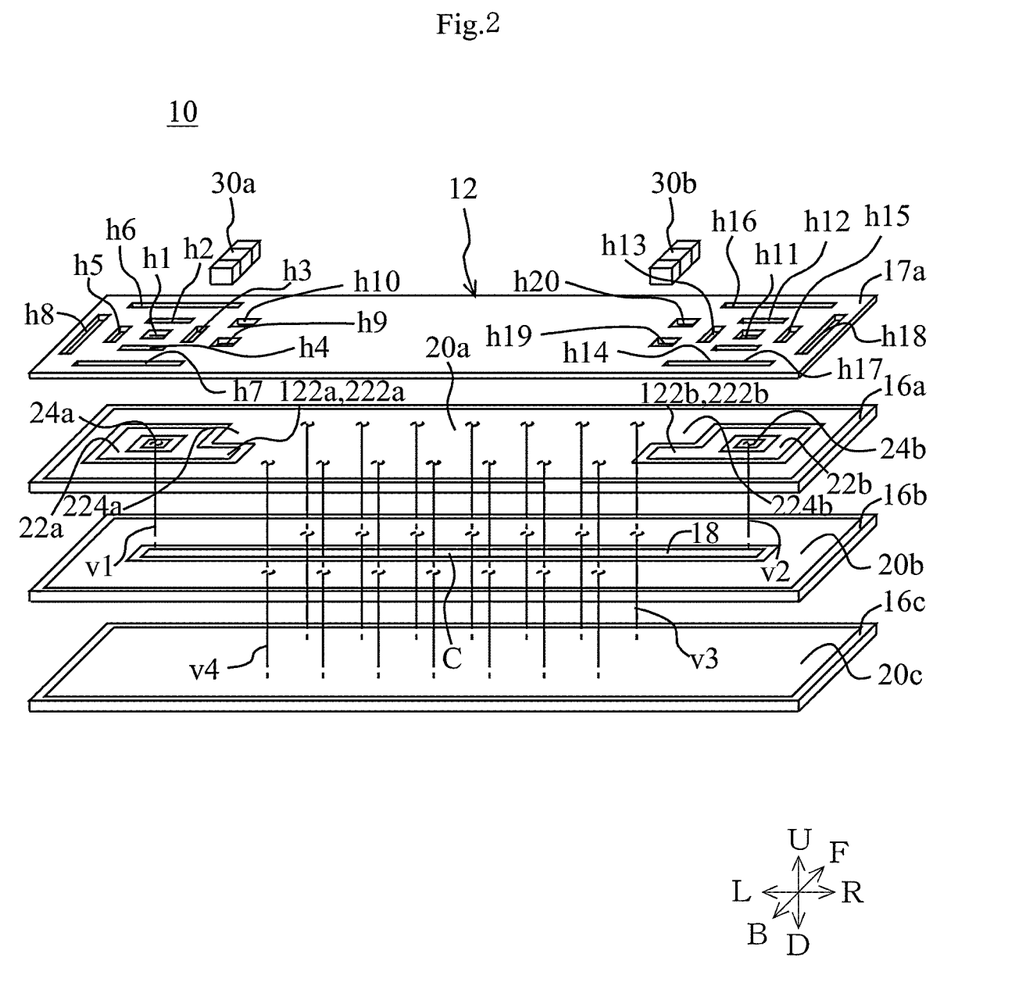
FIG. 2 is an exploded perspective view of the circuit board 10.
Figure 3:
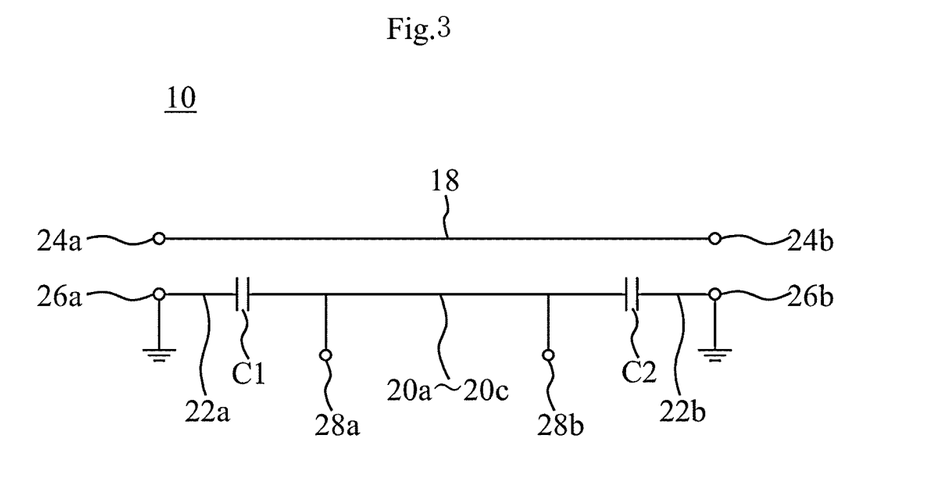
FIG. 3 is an equivalent circuit diagram of the circuit board 10.

A structure of a circuit board 10 according to a preferred embodiment of the present invention will be described below with reference to the drawings. FIG. 1 an external perspective view of the circuit board 10. FIG. 2 is an exploded perspective view of the circuit board 10. FIG. 3 is an equivalent circuit diagram of the circuit board 10.

In the present specification, directions are defined in the following manner. A stacking direction of a board body 12 of the circuit board 10 is defined as a circuit board upward-downward direction. A longitudinal direction of the circuit board 10 is defined as a circuit board leftward-rightward direction. A lateral direction of the circuit board 10 is defined as a circuit board forward-backward direction. The circuit board upward-downward direction, the circuit board forward-backward direction, and the circuit board leftward-rightward direction are orthogonal to one another. The circuit board upward-downward direction, the circuit board forward-backward direction, and the circuit board leftward-rightward direction need not coincide with an upward-downward direction, a forward-backward direction, and a leftward-rightward direction when the circuit board 10 is actually used.

The circuit board 10 is used to connect two circuits in an electronic device, such as a cellular phone, for example. As shown in FIGS. 1 and 2, the circuit board 10 includes the board body 12, a signal conductor 18, a first power supply conductor 20a, a second power supply conductor 20b, a third power supply conductor 20c, a first reference conductor 22a, a second reference conductor 22b, a first signal electrode 24a, a second signal electrode 24b, first reference electrodes 26a (see FIG. 1), second reference electrodes 26b (see FIG. 1), first power supply electrodes 28a (see FIG. 1), second power supply electrodes 28b (see FIG. 1), a first chip capacitor 30a, a second chip capacitor 30b, reference electrodes 222a and 222b, power supply electrodes 224a and 224b, a first interlayer connection conductor v1, a second interlayer connection conductor v2, a plurality of third interlayer connection conductors v3, and a plurality of fourth interlayer connection conductors v4. A typical interlayer connection conductor of the plurality third interlayer connection of conductors v3 and a typical interlayer connection conductor of the plurality of fourth interlayer connection conductors v4 are denoted by reference characters in FIG. 2.

As shown in FIGS. 1 and 2, the board body 12 has a plate shape. As shown in FIGS. 1 and 2, the board body 12 has a rectangular or substantially rectangular shape including long sides extending in the circuit board leftward-rightward direction as viewed in the circuit board upward-downward direction. The board body 12 has flexibility. Thus, the board body 12 can be used in a state of being bent in an electronic device.

As shown in FIG. 2, the board body 12 has a structure including a resist layer 17a and insulating resin layers 16a to 16c (a plurality of insulator layers) that are stacked in the circuit board upward-downward direction. The resist layer 17a and the insulating resin layers 16a to 16c are stacked so as to be aligned in this order from top to bottom in the circuit board upward-downward direction. The insulating resin layers 16a to 16c are dielectric sheets having flexibility. A material for each of the insulating resin layers 16a to 16c is, for example, a thermoplastic resin, such as polyimide or a liquid crystal polymer. The insulating resin layers 16a to 16c have the same or substantially the same rectangular or substantially rectangular shape as the board body 12 as viewed in the circuit board upward-downward direction. The resist layer 17a will be described later.

As shown in FIG. 2, the signal conductor 18 is provided in the board body 12. More specifically, the signal conductor 18 is provided at an upper principal surface of the insulating resin layer 16b. With this configuration, the signal conductor 18 is provided inside the board body 12. The signal conductor 18 is a conductor layer having a linear shape extending in the circuit board leftward-rightward direction. The signal conductor 18 is arranged midway in the circuit board forward-backward direction of the upper principal surface of the insulating resin layer 16b. A left end of the signal conductor 18 is located at a left end portion of the insulating resin layer 16b. A right end of the signal conductor 18 is located at a right end portion of the insulating resin layer 16c. A high frequency signal is transmitted through the signal conductor 18.

The first power supply conductor 20a is provided in the board body 12. The first power supply conductor 20a is positioned above the signal conductor 18 in the circuit board upward-downward direction so as to overlap with the signal conductor 18 as viewed in the circuit board upward-downward direction. In the present specification, the expression "the first power supply conductor 20a is positioned above the signal conductor 18 in the circuit board upward-downward direction" refers to the following state. At least a portion of the first power supply conductor 20a is positioned in a region through which the signal conductor 18 extends when the signal conductor 18 extends parallel or substantially parallel in a circuit board upward direction. Thus, the first power supply conductor 20a may be within the region, through which the signal conductor 18 passes when the signal conductor 18 extends parallel or substantially parallel in the circuit board upward direction or may protrude from the region, through which the signal conductor 18 passes when the signal conductor 18 extends parallel or substantially parallel in the circuit board upward direction. In the present preferred embodiment, the first power supply conductor 20a is protruding from the region, through which the signal conductor 18 passes when the signal conductor 18 extends parallel or substantially parallel in the circuit board upward direction.

The first power supply conductor 20a is provided at an upper principal surface of the insulating resin layer 16a. As shown in FIG. 2, the first power supply conductor 20a is a conductor layer having a rectangular or substantially rectangular shape including long sides extending in the circuit board leftward-rightward direction as viewed in the circuit board upward-downward direction. The first power supply conductor 20a has a shape corresponding or substantially corresponding to the board body 12 as viewed in the circuit board upward-downward direction. The first power supply conductor 20a is slightly smaller than the board body 12 as viewed in the circuit board upward-downward direction.

As described earlier, the first power supply conductor 20a overlaps with the signal conductor 18 as viewed in the circuit board upward-downward direction. With this configuration, the first power supply conductor 20a extends along at least a portion of the signal conductor 18. More specifically, the first power supply conductor 20a overlaps with at least a portion of the signal conductor 18 as viewed in the circuit board upward-downward direction (the board body stacking direction). In the present preferred embodiment, the first power supply conductor 20a overlaps with a portion excluding a left end portion and a right end portion of the signal conductor 18 as viewed in the circuit board upward-downward direction. Thus, the first power supply conductor 20a extends in the circuit board leftward-rightward direction along the signal conductor 18 in the portion excluding the left end portion and the right end portion of the signal conductor 18. With this configuration, the first power supply conductor 20a is adjacent to the portion excluding the left end portion and the right end portion of the signal conductor 18.

The third power supply conductor 20c is provided in the board body 12. The third power supply conductor 20c is positioned below the signal conductor 18 in the circuit board upward-downward direction so as to overlap with the signal conductor 18 as viewed in the circuit board upward-downward direction. The third power supply conductor 20c is provided at an upper principal surface of the insulating resin layer 16c. As shown in FIG. 2, the third power supply conductor 20c is a conductor layer having a rectangular or substantially rectangular shape including long sides extending in the circuit board leftward-rightward direction as viewed in the circuit board upward-downward direction. The third power supply conductor 20c has a shape corresponding or substantially corresponding the board body 12 as viewed in the circuit board upward-downward direction. The third power supply conductor 20c is slightly smaller than the board body 12 as viewed in the circuit board upward-downward direction.

As described earlier, the third power supply conductor 20c overlaps with the signal conductor 18 as viewed in the circuit board upward-downward direction. With this configuration, the third power supply conductor 20c extends along at least a portion of the signal conductor 18. More specifically, the third power supply conductor 20c overlaps with at least a portion of the signal conductor 18 as viewed in the circuit board upward-downward direction (the board body stacking direction). In the present preferred embodiment, the third power supply conductor 20c overlaps with a portion excluding a left end portion and a right end portion of the signal conductor 18 as viewed in the circuit board upward-downward direction. Thus, the third power supply conductor 20c extends in the circuit board leftward-rightward direction along the signal conductor 18 in the portion excluding the left end portion and the right end portion of the signal conductor 18. With this configuration, the third power supply conductor 20c is adjacent to the portion excluding the left end portion and the right end portion of the signal conductor 18.

The second power supply conductor 20b is provided in the board body 12. The second power supply conductor 20b is positioned at the same or substantially the same position as the signal conductor 18 in the circuit board upward-downward direction. The second power supply conductor 20b is provided at an upper principal surface of the insulating resin layer 16b. As shown in FIG. 2, the second power supply conductor 20b is a conductor layer having a rectangular or substantially rectangular shape including long sides extending in the circuit board leftward-rightward direction as viewed in the circuit board upward-downward direction. The second power supply conductor 20b has a shape corresponding or substantially corresponding to the board body 12 as viewed in the circuit board upward-downward direction. The second power supply conductor 20b is slightly smaller than the board body 12 as viewed in the circuit board upward-downward direction.

The second power supply conductor 20b extends along at least a portion of the signal conductor 18. In the present preferred embodiment, the second power supply conductor 20b extends along the entire or substantially the entire signal conductor 18. More specifically, the second power supply conductor 20b is not provided in immediate surroundings of the signal conductor 18 such that the second power supply conductor 20b is insulated from the signal conductor 18. With this configuration, the signal conductor 18 is surrounded by the second power supply conductor 20b as viewed in the circuit board upward-downward direction. Thus, the second power supply conductor 20b extends along the entire or substantially the entire signal conductor 18. As a result, the second power supply conductor 20b is adjacent to the entire or substantially the entire signal conductor 18.

The first power supply conductor 20a, the second power supply conductor 20b, and the third power supply conductor 20c as described above are connected to a power supply potential. The power supply potential is, for example, about 1.8 V, about 3 V, or the like.

The first reference conductor 22a is provided in the board body 12. The first reference conductor 22a is provided at a left end portion of the upper principal surface of the insulating resin layer 16a. The signal conductor 18 is provided at the upper principal surface of the insulating resin layer 16b. For this reason, the first reference conductor 22a is insulated from the signal conductor 18. The first reference conductor 22a is a conductor layer having a rectangular or substantially rectangular shape as viewed in the circuit board upward-downward direction. The first reference conductor 22a includes a protruding portion 122a which protrudes from a right side of the rectangular or substantially rectangular shape to a circuit board rightward direction as viewed in the circuit board upward-downward direction.

The first reference conductor 22a is insulated from the first power supply conductor 20a. For this reason, the first power supply conductor 20a is not provided in immediate surroundings of the first reference conductor 22a. With this configuration, the first reference conductor 22a is surrounded by the first power supply conductor 20a as viewed in the circuit board upward-downward direction. The first reference conductor 22a is not in contact with the first power supply conductor 20a. The second reference conductor 22b is structured to be a mirror image of the first reference conductor 22a. Thus, a description of the second reference conductor 22b will be omitted.

The first reference conductor 22a and the second reference conductor 22b as described above are connected to a reference potential. The reference potential is, for example, a ground potential (that is, 0 V). In this case, the first reference conductor 22a and the second reference conductor 22b are ground conductors.

The first signal electrode 24a is used as an interface to external circuits. The first signal electrode 24a is provided at the left end portion of the upper principal surface of the insulating resin layer 16a. The first signal electrode 24a overlaps with the left end portion of the signal conductor 18 as viewed in the circuit board upward-downward direction. The first signal electrode e 24a has a rectangular or substantially rectangular shape as viewed in the circuit board upward-downward direction. The first reference conductor 22a is not provided in immediate surroundings of the first signal electrode 24a such that the first signal electrode 24a is insulated from the first reference conductor 22a.

The first interlayer connection conductor v1 is provided at a left end portion of the insulating resin layer 16a. The first interlayer connection conductor v1 extends through the insulating resin layer 16a in an upward-downward direction. An upper end of the first interlayer connection conductor v1 is connected to the first signal electrode 24a. A lower end of the first interlayer connection conductor v1 is connected to the left end portion of the signal conductor 18. With this configuration, the first interlayer connection conductor v1 connects the signal conductor 18 and the first signal electrode 24a together. That is, the first signal electrode 24a is connected to the left end portion (a first end portion) of the signal conductor 18. The first interlayer connection conductor v1 is, for example, a via hole conductor. The via hole conductor is formed by filling a through-hole extending through the insulating resin layer 16a in the upward-downward direction with a conductive paste and sintering the conductive paste. A high frequency signal is input to or output from the signal conductor 18 via the first signal electrode 24a.

The second signal electrode 24b and the second interlayer connection conductor v2 are structured to be a mirror image of the first signal electrode 24a and the first interlayer connection conductor v1. Thus, a description of the second signal electrode 24b and the second interlayer connection conductor v2 will be omitted.

The resist layer 17a is an insulative protective layer having flexibility. The resist layer 17a covers the entire or substantially the entire upper principal surface of the insulating resin layer 16a. With this configuration, the resist layer 17a protects the first power supply conductor 20a, the first reference conductor 22a, and the second reference conductor 22b.

Openings h1 to h10 are provided in the resist layer 17a. The opening h1 overlaps with the first signal electrode 24a as viewed in the circuit board upward-downward direction. With this configuration, the first signal electrode 24a is exposed from the circuit board 10 to the outside via the opening h1.

The opening h2 is provided in front of the opening h1 in the circuit board forward-backward direction. The opening h3 is provided to the right of the opening h1 in the circuit board leftward-rightward direction. The opening h4 is provided behind the opening h1 in the circuit board forward-backward direction. The opening h5 is provided to the left of the opening h1 in the circuit board leftward-rightward direction. With this configuration, the first reference conductor 22a is exposed from the circuit board 10 to the outside via the openings h2 to h5. Portions exposed via the openings h2 to h5 in the first reference conductor 22a are the first reference electrodes 26a, as shown in FIG. 1. The first reference electrodes 26a are used as an interface to external circuits and are connected to the first reference conductor 22a.

The opening h6 is provided in front of the opening h2 in the circuit board forward-backward direction. The opening h7 is provided behind the opening h4 in the circuit board forward-backward direction. The opening h8 is provided to the left of the opening h5 in the circuit board leftward-rightward direction. With this configuration, the first power supply conductor 20a is exposed from the circuit board 10 to the outside via the openings h6 to h8. Portions exposed via the openings h6 to h8 in the first power supply conductor 20a are the first power supply electrodes 28a, as shown in FIG. 1. The first power supply electrodes 28a are used as an interface to external circuits and are connected to the first power supply conductor 20a.

The opening h9 is provided to the right of the opening h3 in the circuit board leftward-rightward direction. With this configuration, the protruding portion 122a of the first reference conductor 22a is exposed to the outside via the opening h9. A portion exposed via the opening h9 in the protruding portion 122a of the first reference conductor 22a is the reference electrode 222a. The reference electrode 222a is connected to the first reference conductor 22a.

The opening h10 is provided to the right of the opening h3 in the circuit board leftward-rightward direction. The opening h10 is provided in front of the opening h9 in the circuit board forward-backward direction. With this configuration, the first power supply conductor 20a is exposed to the outside via the opening h10. A portion exposed via the opening h10 in the first power supply conductor 20a is the power supply electrode 224a. The power supply electrode 224a is connected to the first power supply conductor 20a.

Openings h11 to h20, the second reference electrodes 26b, the second power supply electrodes 28b, the reference electrode 222b, and the power supply electrode 224b are structured to be a mirror image of the openings h1 to h10, the first reference electrodes 26a, the first power supply electrodes 28a, the reference electrode 222a, and the power supply electrode 224a. Thus, a description of the openings h11 to h20, the second reference electrodes 26b, the second power supply electrodes 28b, the reference electrode 222b, and the power supply electrode 224b will be omitted.

The signal conductor 18, the first power supply conductor 20a, the second power supply conductor 20b, the third power supply conductor 20c, the first reference conductor 22a, the second reference conductor 22b, the first signal electrode 24a, and the second signal electrode 24b as described above are formed by, for example, etching copper foil provided on the upper principal surfaces or lower principal surfaces of the insulating resin layers 16a to 16c.

The plurality of third interlayer connection conductors v3 are provided in the board body 12 so as to be located in front of the signal conductor 18 in the circuit board forward-backward direction. The plurality of third interlayer connection conductors v3 are aligned at equal or substantially equal intervals in the circuit board leftward-rightward direction. The plurality of third interlayer connection conductors v3 extend through the insulating resin layers 16a and 16b in the circuit board upward-downward direction. Upper ends of the plurality of third interlayer connection conductors v3 are connected to the first power supply conductor 20a. Intermediate portions of the plurality of third interlayer connection conductors v3 are connected to the second power supply conductor 20b. Lower ends of the plurality of third interlayer connection conductors v3 are connected to the third power supply conductor 20c. With this configuration, the plurality of third interlayer connection conductors v3 connect the first power supply conductor 20a, the second power supply conductor 20b, and the third power supply conductor 20c together.

The plurality of fourth interlayer connection conductors v4 are provided in the board body 12 so as to be located behind the signal conductor 18 in the circuit board forward-backward direction. The plurality of fourth interlayer connection conductors v4 are aligned up at equal or substantially equal intervals in the circuit board leftward-rightward direction. The plurality of fourth interlayer connection conductors v4 extend through the insulating resin layers 16a and 16b in the circuit board upward-downward direction. Upper ends of the plurality of fourth interlayer connection conductors v4 are connected to the first power supply conductor 20a. Intermediate portions of the plurality of fourth interlayer connection conductors v4 are connected to the second power supply conductor 20b. Lower ends of the plurality of fourth interlayer connection conductors v4 are connected to the third power supply conductor 20c. With this configuration, the plurality of fourth interlayer connection conductors v4 connect the first power supply conductor 20a, the second power supply conductor 20b, and the third power supply conductor 20c together. The plurality of third interlayer connection conductors v3 and the plurality of fourth interlayer connection conductors v4 are, for example, via hole conductors. Each via hole conductor is formed by, for example, filling a through-hole extending through the insulating resin layers 16a and 16b in the upward-downward direction with a conductive paste and sintering the conductive paste.

As shown in FIG. 3, the first reference conductor 22a is connected to the first power supply conductor 20a via a first capacitance C1. The first chip capacitor 30a in FIGS. 1 and 2 is the first capacitance C1. More specifically, the first chip capacitor 30a is mounted on the reference electrode 222a and the power supply electrode 224a with, for example, solder, as shown in FIG. 2. Thus, a first capacitor electrode of the first chip capacitor 30a is connected to the first reference conductor 22a. A second capacitor electrode of the first chip capacitor 30a is connected to the first power supply conductor 20a.

Here, the signal conductor 18 includes the left end portion (first end portion), the right end portion (a second end portion), and a center point C, as shown in FIG. 2. The center point C is located midway between the left end portion (first end portion) and the right end portion (second end portion) in a path provided by the signal conductor 18. As shown in FIGS. 1 and 2, the reference electrode 222a and the power supply electrode 224a are disposed nearer to the left end portion (first end portion) of the signal conductor 18 than to the center point C of the signal conductor 18. In the present preferred embodiment, the reference electrode 222a and the power supply electrode 224a are disposed in the vicinity of the left end portion of the signal conductor 18. The first chip capacitor 30a is mounted on the reference electrode 222a and the power supply electrode 224a. For this reason, the first reference conductor 22a is connected to the first power supply conductor 20a via the first capacitance C1 at a point nearer to the left end portion (first end portion) of the signal conductor 18 than to the center point C of the signal conductor 18. In the present preferred embodiment, the first reference conductor 22a is connected to the first power supply conductor 20a via the first capacitance C1 in the vicinity of the left end portion (first end portion) of the signal conductor 18.

As shown in FIG. 3, the second reference conductor 22b is connected to the first power supply conductor 20a via a second capacitance C2. The second chip capacitor 30b in FIGS. 1 and 2 is the second capacitance C2. More specifically, the second chip capacitor 30b is mounted on the reference electrode 222b and the power supply electrode 224b with, for example, solder, as shown in FIG. 2. Thus, a first capacitor electrode of the second chip capacitor 30b is connected to the second reference conductor 22b. A second capacitor electrode of the second chip capacitor 30b is connected to the first power supply conductor 20a.

As shown in FIG. 2, the reference electrode 222b and the power supply electrode 224b are located nearer to the right end portion (second end portion) of the signal conductor 18 than to the center point C of the signal conductor 18. In the present preferred embodiment, the reference electrode 222b and the power supply electrode 224b are located in the vicinity of the right end portion of the signal conductor 18. The second chip capacitor 30b is mounted on the reference electrode 222b and the power supply electrode 224b. For this reason, the second reference conductor 22b is connected to the first power supply conductor 20a via the second capacitance C2 at a point nearer to the right end portion (first end portion) of the signal conductor 18 than to the center point C of the signal conductor 18. In the present preferred embodiment, the second reference conductor 22b is connected to the first power supply conductor 20a via the second capacitance C2 in the vicinity of the right end portion (second end portion) of the signal conductor 18.

Advantageous Effects

The circuit board 10 can define and function as a high frequency signal transmission line. More specifically, a return current flows through the first power supply conductor 20a when a high frequency signal is transmitted through the signal conductor 18. The return current is preferably guided to the reference potential. In the circuit board 10, the first reference conductor 22a is insulated from the signal conductor 18 and the first power supply conductor 20a. For this reason, when the first reference conductor 22a is connected to the first power supply conductor 20a via the first capacitance C1, a return current flows from the first power supply conductor 20a to a ground potential via the first capacitance C1, the first reference conductor 22a, and the first reference electrodes 26a. With this configuration, the circuit board 10 can define and function as a high frequency signal transmission line.

According to the circuit board 10, both reducing or preventing an increase in size of the circuit board 10 and reducing insertion loss of the circuit board 10 are achieved. More specifically, in a general circuit board, a strip line includes a signal conductor and two reference conductors. Sometimes such a circuit board further includes a power supply conductor. It may be difficult to provide space for a power supply conductor having a large area when reducing or preventing an increase in size of a circuit board. This results in increase in resistance value of a power supply conductor.

In the circuit board 10, the first power supply conductor 20a extends along at least a portion of the signal conductor 18. With this configuration, a capacitance which is generated between the first power supply conductor 20a and the signal conductor 18 is used in the circuit board 10 to define a high frequency signal transmission line through which a high frequency signal is transmitted. For this reason, in the circuit board 10, areas of the first reference conductor 22a and the second reference conductor 22b can be reduced, and an area of the first power supply conductor 20a can be increased. This achieves reducing or preventing an increase in size of the circuit board 10.

Additionally, the increase in area of the first power supply conductor 20a leads to a reduction in resistance value of the first power supply conductor 20a. Thus, a return current is likely to flow through the first power supply conductor 20a when a high frequency signal is transmitted through the signal conductor 18. As a result, a reduction in insertion loss of the circuit board 10 is achieved.

According to the circuit board 10, noise can be reduced or prevented from affecting a high frequency signal which is transmitted through the signal conductor 18. More specifically, the capacitance that is generated between the first power supply conductor 20a and the signal conductor 18 is used in the circuit board 10 to define the high frequency signal transmission line, through which a high frequency signal is transmitted. In this case, noise passing through the first power supply electrodes 28a and the second power supply electrodes 28b into the circuit board 10 may affect a high frequency signal which is transmitted through the signal conductor 18.

Under the circumstances, the first reference conductor 22a is insulated from the signal conductor 18 and the first power supply conductor 20a in the circuit board 10. With this configuration, when the first reference conductor 22a is connected to the first power supply conductor 20a via the first capacitance C1, noise passing through the first power supply electrodes 28a and the second power supply electrodes 28b into the circuit board 10 flows to the reference potential via the first power supply conductor 20a, the first capacitance C1, and the first reference electrodes 26a. As a result, noise can be reduced or prevented from affecting a high frequency signal which is transmitted through the signal conductor 18.

According to the circuit board 10, a reduction in insertion loss of the circuit board 10 is further achieved. More specifically, the first reference conductor 22a is connected to the first power supply conductor 20a via the first capacitance C1 at a point nearer to the left end portion (first end portion) of the signal conductor 18 than to the center point C of the signal conductor 18. With this configuration, a portion where the first reference conductor 22a and the first power supply conductor 20a are connected via the first capacitance C1 is spaced away from the center point C of the signal conductor 18. For this reason, a portion over which the signal conductor 18 extends along the first power supply conductor 20a is long. In the high frequency signal transmission line, a portion over which the first power supply conductor 20a having the low resistance value is used is long. As a result, according to the circuit board 10, a reduction in insertion loss of the circuit board 10 is further achieved.

According to the circuit board 10, a reduction in insertion loss of the circuit board 10 is further achieved. More specifically, the second reference conductor 22b is connected to the first power supply conductor 20a via the second capacitance C2 at a point nearer to the right end portion (second end portion) of the signal conductor 18 than to the center point C of the signal conductor 18. With this configuration, a portion where the second reference conductor 22b and the first power supply conductor 20a are connected via the second capacitance C2 is spaced away from the center point C of the signal conductor 18. For this reason, a section over which the signal conductor 18 extends along the first power supply conductor 20a is long. In the high frequency signal transmission line, a section over which the first power supply conductor 20a having the low resistance value is used is long. As a result, according to the circuit board 10, a reduction in insertion loss of the circuit board 10 is further achieved.

According to the circuit board 10, a reduction in size of the circuit board 10 is achieved. More specifically, the first chip capacitor 30a is the first capacitance C1. The first chip capacitor 30a easily achieves a large capacitance value. Thus, a larger reduction in size is achieved in the circuit board 10 than in a circuit board which does not include a chip capacitor to obtain the first capacitance C1.

First Modification

Figure 4:
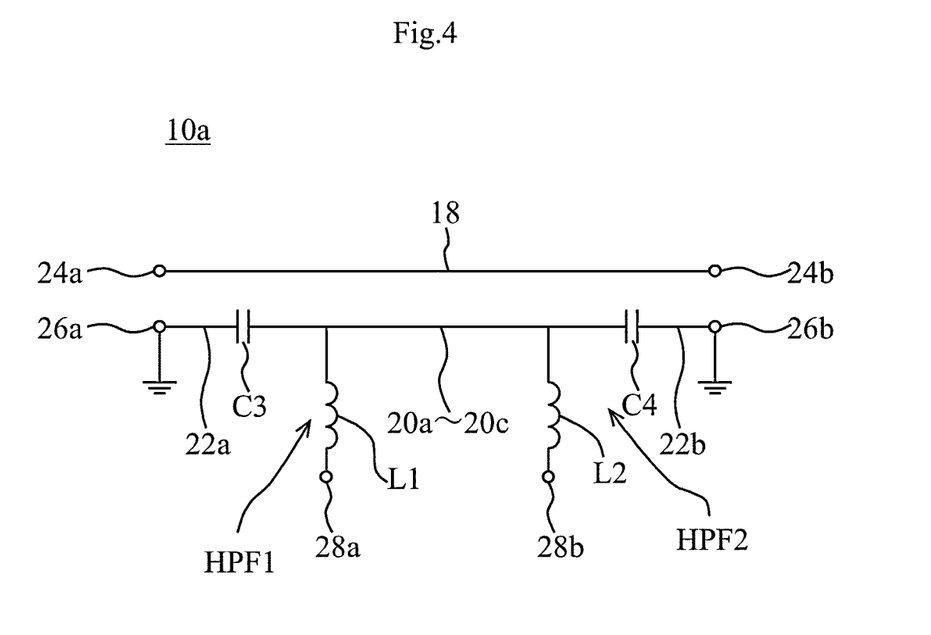
FIG. 4 is an equivalent circuit diagram of a circuit board 10a according to a preferred embodiment of the present invention.

A circuit board 10a according to a first modification of a preferred embodiment of the present invention will be described below with reference to the drawings. FIG. 4 is an equivalent circuit diagram of the circuit board 10a.

The circuit board 10a is different from the circuit board 10 in that the circuit board 10a includes a first high pass filter HPF1 and a second high pass filter HPF2, instead of the first capacitance C1 and the second capacitance C2. This aspect will be described below.

The first reference conductor 22a is connected to the first power supply conductor 20a via the first high pass filter HPF1. The first high pass filter HPF1 includes a third capacitance C3 and an inductor L1. The third capacitance C3 is connected to the first power supply conductor 20a and the first reference conductor 22a, similar to the first capacitance C1. The inductor L1 is connected to the first power supply conductor 20a and the first power supply electrodes 28a. A pass band of the first high pass filter HPF1 includes a frequency of a high frequency signal which is transmitted through the signal conductor 18. A return current has the same or substantially the same frequency as a high frequency signal which is transmitted through the signal conductor 18. Thus, the return current can pass between the first power supply conductor 20a and the first reference conductor 22a. Noise can pass between the first power supply conductor 20a and the first reference conductor 22a. The inductor L1 may be, for example, a chip inductor or wiring inside the circuit board 10a.

The second reference conductor 22b is connected to the first power supply conductor 20a via the second high pass filter HPF2. The second high pass filter HPF2 includes a fourth capacitance C4 and an inductor L2. The fourth capacitance C4 is connected to the first power supply conductor 20a and the second reference conductor 22b, similar to the second capacitance C2. The inductor L2 is connected to the first power supply conductor 20a and the second power supply electrodes 28b. A pass band of the second high pass filter HPF2 includes a frequency of a high frequency signal which is transmitted through the signal conductor 18. A return current has the same or substantially the same frequency as a high frequency signal which is transmitted through the signal conductor 18. Thus, the return current can pass between the first power supply conductor 20a and the second reference conductor 22b. Noise can pass between the first power supply conductor 20a and the second reference conductor 22b. The inductor L2 may be, for example, a chip inductor or wiring inside the circuit board 10a. Since the remainder of the structure of the circuit board 10a is the same or substantially the same as the circuit board 10, a description thereof will be omitted.

In the circuit board 10a, the inductor L1 is included. With this configuration, if a desired pass band is difficult to obtain only with the third capacitance C3, the desired pass band can be obtained with the first high pass filter HPF1 including the third capacitance C3 and the inductor L1. For the same reason, a desired pass band can be obtained with the second high pass filter HPF2.

Second Modification

Figure 5:
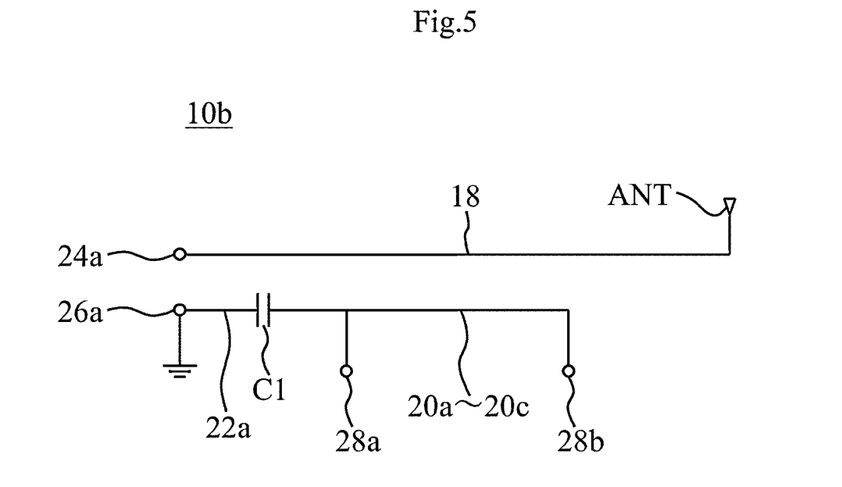
FIG. 5 is an equivalent circuit diagram of a circuit board 10b according to a preferred embodiment of the present invention.

A circuit board 10b according to a second modification of a preferred embodiment of the present invention will be described below with reference to the drawings. FIG. 5 is an equivalent circuit diagram of the circuit board 10b.

The circuit board 10b is different from the circuit board 10 in that the circuit board 10b includes an antenna ANT, instead of the second capacitance C2, the second reference conductor 22b, and the second reference electrodes 26b. This aspect will be described below.

The circuit board 10b further includes the antenna ANT. A right end portion of the signal conductor 18 is connected to the antenna ANT for transmission and/or reception of a high frequency signal. The antenna ANT is defined by, for example, a conductor layer of the circuit board 10b. In this case, the antenna ANT is a part of the circuit board 10b. Note that the antenna ANT need not be a part of the circuit board 10b. Thus, the circuit board 10b is connected to the antenna ANT or an integrated circuit including the antenna ANT.

If the signal conductor 18 is connected to the antenna ANT, the circuit board 10b need not transmit a reference potential connected to the first reference electrodes 26a to a subsequent circuit board. For this reason, the circuit board 10b does not include the second capacitance C2, the second reference conductor 22b, and the second reference electrodes 26b. Since the remainder of the structure of the circuit board 10b is the same or substantially the same as the circuit board 10, a description thereof will be omitted.

Third Modification

Figure 6:
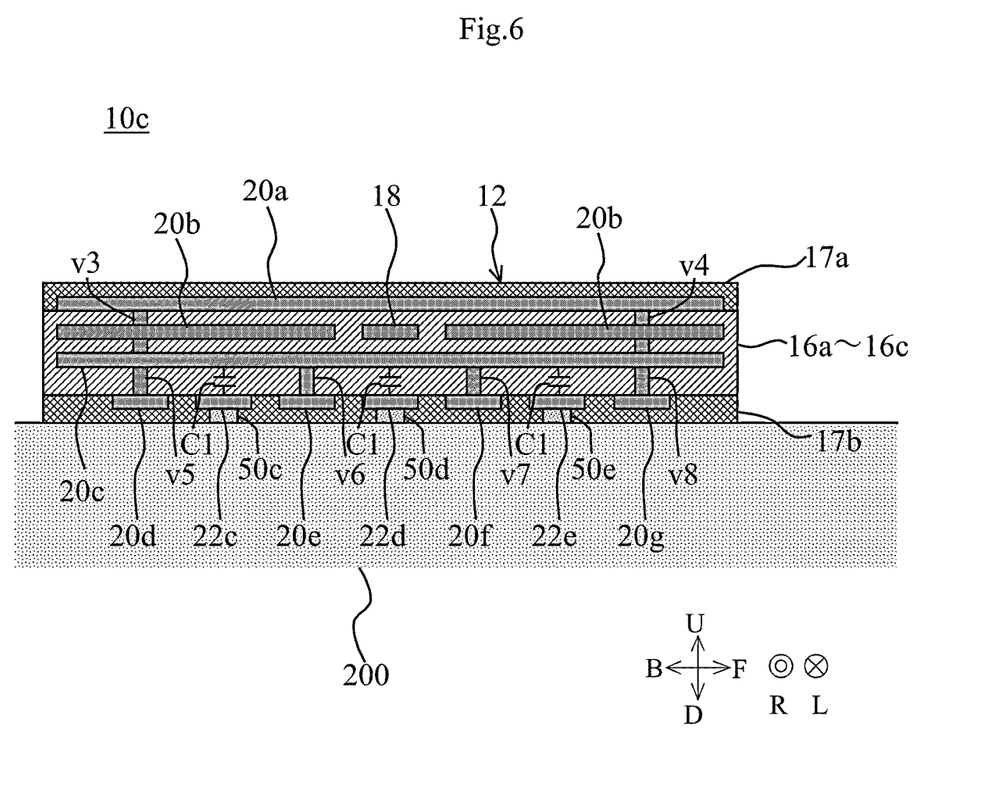
FIG. 6 is a sectional view of a circuit board 10c according to a preferred embodiment of the present invention.

A circuit board 10c according to a third modification of a preferred embodiment of the present invention will be described below with reference to the drawings. FIG. 6 is a sectional view of the circuit board 10c. A section orthogonal or substantially orthogonal to a leftward-rightward direction is shown in FIG. 6.

The circuit board 10c is different from the circuit board 10 in that the circuit board 10c further includes power supply conductors 20d to 20g, reference conductors 22c to 22e, and interlayer connection conductors v5 to v8 and that the board body 12 further includes a resist layer 17b. The differences will be described below.

The power supply conductor 20d, the reference conductor 22c, the power supply conductor 20e, the reference conductor 22d, the power supply conductor 20f, the reference conductor 22e, and the power supply conductor 20g are aligned in this order from back to front in a circuit board forward-backward direction. The power supply conductors 20d to 20g and the reference conductors 22c to 22e extend in the circuit board forward-backward direction. The reference conductors 22c to 22e described above are connected to the third power supply conductor 20c via first capacitances C1 and are insulated from the signal conductor 18.

The interlayer connection conductor v5 connects the third power supply conductor 20c and the power supply conductor 20d together. The interlayer connection conductor v6 connects the third power supply conductor 20c and the power supply conductor 20e together. The interlayer connection conductor v7 connects the third power supply conductor 20c and the power supply conductor 20f together. The interlayer connection conductor v8 connects the third power supply conductor 20c and the power supply conductor 20g together.

The resist layer 17b is an insulative protective layer having flexibility. The resist layer 17b covers an entire or substantially an entire lower principal surface of the insulating resin layer 16c. With this configuration, the resist layer 17b protects the power supply conductors 20d to 20g and the reference conductors 22c to 22e.

openings are provided in the resist layer 17b. The openings overlap with the reference conductors 22c to 22e as viewed in a circuit board upward-downward direction. With this configuration, the reference conductors 22c to 22e are exposed from the circuit board 10c to the outside via the openings. In the present preferred embodiment, gold-plated layers 50c to 50e are provided on the reference conductors 22c to 22e.

The circuit board 10c as described above is fixed to a metal housing 200 which is connected to a reference potential, as shown in FIG. 6. In this case, the gold-plated layers 50c to 50e are connected to the metal housing 200. Thus, the reference conductors 22c to 22e are connected to the reference potential. Each of the reference conductors 22c to 22e may be connected to the metal housing 200 at a plurality of points. That is, the circuit board 10c may have the structure of the section in FIG. 6 at each of the plurality of points. Since the remainder of the structure of the circuit board 10c is the same or substantially the same as the circuit board 10, a description thereof will be omitted.

According to the circuit board 10c, noise can be reduced or prevented from affecting a high frequency signal which is transmitted through the signal conductor 18. More specifically, the reference conductors 22c to 22e are capacitively coupled to the third power supply conductor 20c. Thus, noise flows from the third power supply conductor 20c to the reference conductors 22c to 22e. The noise flows to the metal housing 200 via the gold-plated layers 50c to 50e. As a result, according to the circuit board 10c, noise can be reduced or prevented from affecting a high frequency signal which is transmitted through the signal conductor 18. Since each of the reference conductors 22c to 22e is connected to the metal housing 200 at a plurality of points, noise can be further reduced or prevented from affecting a high frequency signal which is transmitted through the signal conductor 18. In the circuit board 10c, the gold-plated layers 50c to 50e and the metal housing 200 may be joined to each other with a conductive jointing material, such as solder, for example.

Fourth Modification

Figure 7:
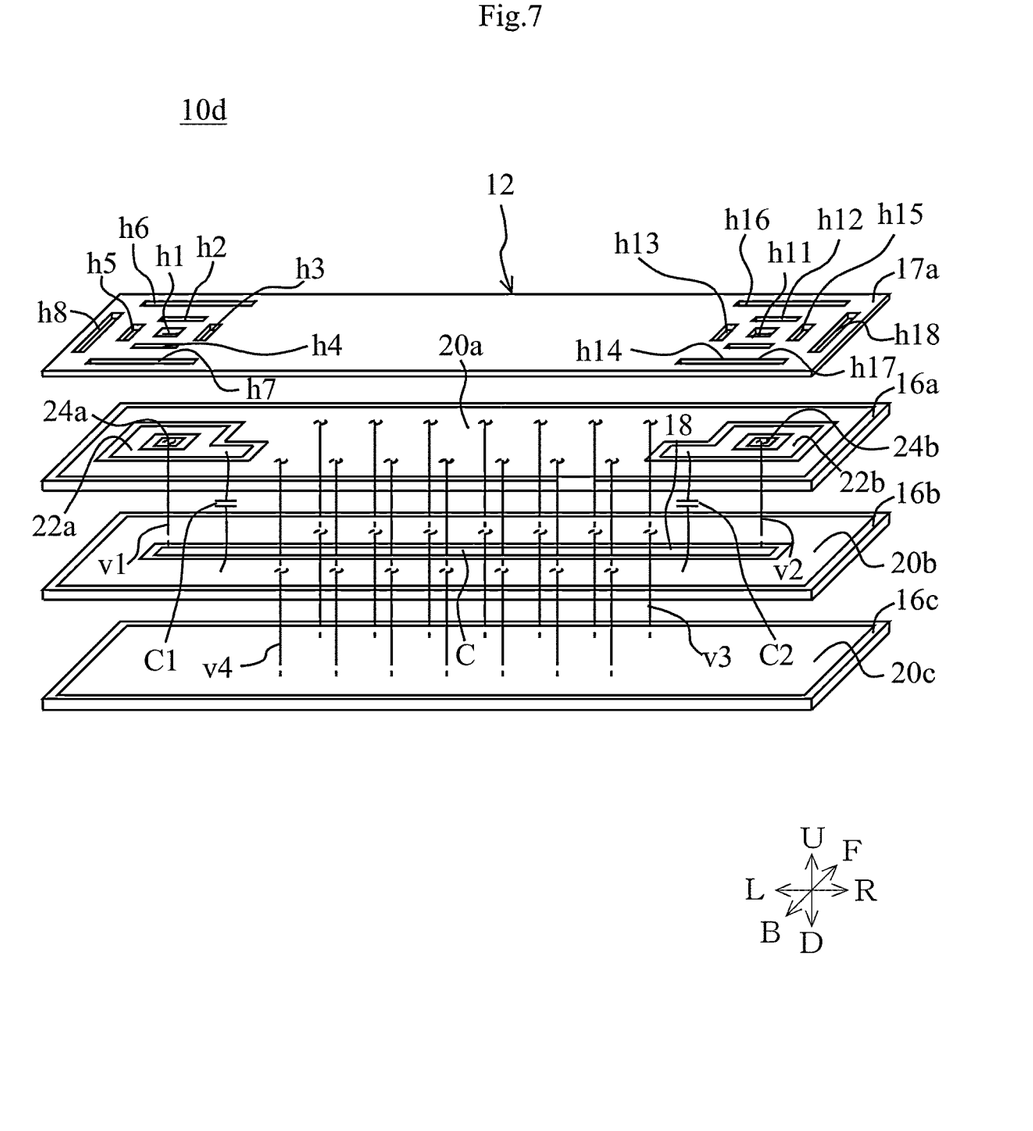
FIG. 7 is an exploded perspective view of a circuit board 10d according to a preferred embodiment of the present invention.

A circuit board 10d according to a fourth modification of a preferred embodiment of the present invention will be described below with reference to the drawings. FIG. 7 is an exploded perspective view of the circuit board 10d.

The circuit board 10d is different from the circuit board 10 in that the circuit board 10d does not include the first chip capacitor 30a and the second chip capacitor 30b. In the circuit board 10d, the first capacitance C1 is a capacitance which is generated between the first reference conductor 22a and the second power supply conductor 20b. The second capacitance C2 is a capacitance which is generated between the second reference conductor 22b and the second power supply conductor 20b. The remainder of the structure of the circuit board 10d is the same or substantially the same as the circuit board 10, and a description thereof will be omitted.

According to the circuit board 10d, the first capacitance C1 and the second capacitance C2 are provided by capacitances. For this reason, the circuit board 10d needs no chip capacitor. Additionally, a chip capacitor mounting process is unnecessary at the time of manufacture of the circuit board 10d. This results in a reduction in manufacturing costs of the circuit board 10d.

Electronic Device

Figure 8:
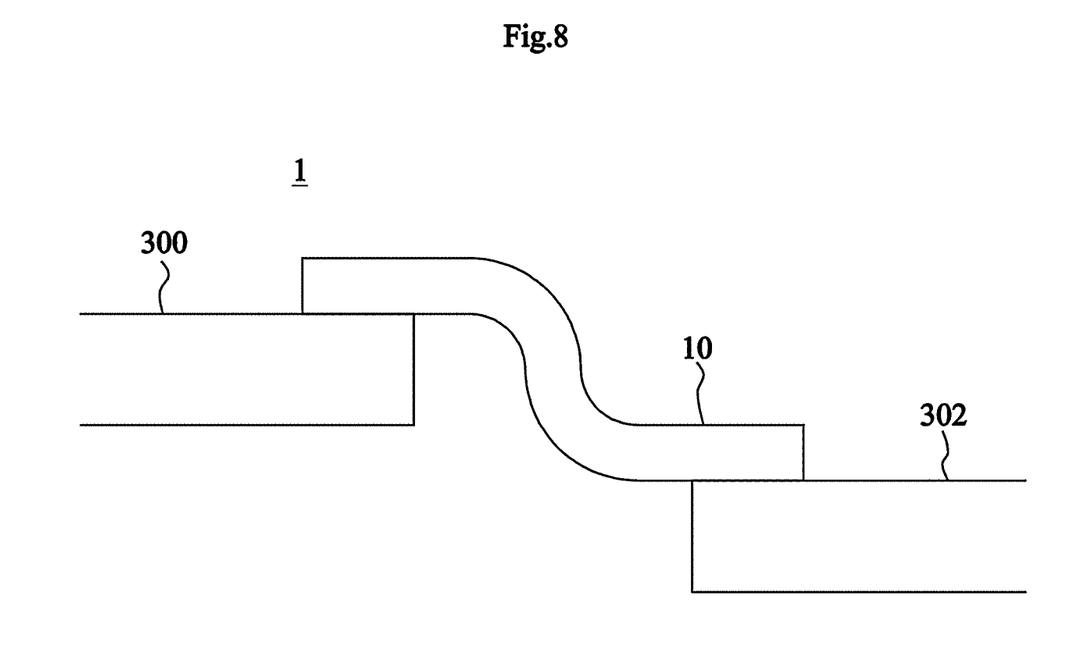
FIG. 8 is a view showing an electronic device 1 according to a preferred embodiment of the present invention.

An electronic device 1 according to a preferred embodiment of the present invention will be described below with reference to the drawings. FIG. 8 is a view showing the electronic device 1. Note that the first chip capacitor 30a and the second chip capacitor 30b are not shown in FIG. 8.

The electronic device 1 is, for example, a portable wireless communication terminal, such as a smartphone. The electronic device 1 includes the circuit board 10, and circuit boards 300 and 302. A left end portion of the circuit board 10 is connected to the circuit board 300. More specifically, the first signal electrode 24a, the first reference electrodes 26a, and the first power supply electrodes 28a are fixed to an electrode of the circuit board 300 with solder, for example.

A right end portion of the circuit board 10 is connected to the circuit board 302. More specifically, the second signal electrode 24b, the second reference electrodes 26b, and the second power supply electrodes 28b are fixed to an electrode of the circuit board 302 with solder, for example. With this configuration, a high frequency signal is transmitted through the signal conductor 18. The first power supply conductor 20a, the second power supply conductor 20b, and the third power supply conductor 20c are connected to a power supply potential. The first reference conductor 22a and the second reference conductor 22b are connected to a reference potential.

A position in an upward-downward direction of the circuit board 300 is different from a position in the upward-downward direction of the circuit board 302. For this reason, the circuit board 10 is bent. Since a material for each of the insulating resin layers 16a to 16c is, for example, a thermoplastic resin, the circuit board 10 can be bent.

The circuit board 10 may be connected to the circuit board 300 and the circuit board 302 via connectors. The electronic device 1 may include any of the circuit boards 10a to 10d, instead of the circuit board 10.

Other Preferred Embodiments

Signal transmission lines according to preferred embodiments of the present invention is not limited to the circuit boards 10 and 10a to 10d, and changes can be made within the scope of the present invention. The configurations of the circuit boards 10 and 10a to 10d may be combined.

In each of the circuit boards 10 and 10a to 10d, the signal conductor 18 extends linearly in a circuit board leftward-rightward direction. However, the signal conductor 18 may be bent as viewed in a circuit board upward-downward direction.

Each of the circuit boards 10 and 10a to 10d only needs to include any one of the first power supply conductor 20a, the second power supply conductor 20b, and the third power supply conductor 20c. In this case, the first reference conductor 22a may be connected to any one of the first power supply conductor 20a, the second power supply conductor 20b, and the third power supply conductor 20c via the first capacitance C1 and be insulated from the signal conductor 18.

In each of the circuit boards 10 and 10a to 10d, the first power supply conductor 20a and/or the third power supply conductor 20c may extend along the entire or substantially the entire signal conductor 18.

In each of the circuit boards 10 and 10a to 10d, the first reference conductor 22a may be connected to the first power supply conductor 20a via the first capacitance C1 at a point nearer to the center point C of the signal conductor 18 than to the left end portion (first end portion) of the signal conductor 18. Further, in each of the circuit boards 10, 10a, 10c, and 10d, the second reference conductor 22b may be connected to the first power supply conductor 20a via the second capacitance C2 at a point nearer to the center point C of the signal conductor 18 than to the right end portion (second end portion) of the signal conductor 18.

Each of the circuit boards 10 and 10b to 10d may include the first high pass filter HPF1. instead of the first capacitance C1. Further, each of the circuit boards 10, 10c, and 10d may include the second high pass filter HPF2, instead of the second capacitance C2.

The circuit board 10c need not include the first reference conductor 22a and the second reference conductor 22b.

In each of the circuit boards 10 and 10b to 10d, only one insulating resin layer may be provided. In this case, the signal conductor 18 and power supply conductors have a coplanar structure. Alternatively, two insulating resin layers may be provided. In this case, the signal conductor 18 and a power supply conductor have a micro-stripline structure.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A circuit board comprising:
   a board body;
   a signal conductor in the board body and through which a high frequency signal is transmitted;
   a power supply conductor in the board body and connected to a power supply potential, the power supply conductor extending along at least a portion of the signal conductor; and
   a first reference conductor in the board body is insulated from the signal conductor and the power supply conductor; wherein
   the board body includes a plurality of insulator layers that are stacked, and each of the signal conductor, the power supply conductor, and the first reference conductor is inside of the stack of the plurality of insulator layers.

2. The circuit board according to claim 1, wherein
   the signal conductor includes a first end portion and a second end portion; and
   the circuit board further includes:
      a first signal electrode to connect to an external circuit and connected to the first end portion of the signal conductor; and
      a first reference electrode to connect to the external circuit and connected to the first reference conductor.

3. The circuit board according to claim 2, wherein the second end portion of the signal conductor is connected to an antenna to transmit and/or receive the high frequency signal.

4. The circuit board according to claim 2, further comprising a second signal electrode to connect to an external circuit and connected to the second end portion of the signal conductor.

5. The circuit board according to claim 1, wherein the first reference conductor is connected to the power supply conductor via a first capacitance.

6. The circuit board according to claim 5, further comprising a first chip capacitor defining the first capacitance.

7. The circuit board according to claim 5, wherein the first capacitance is a capacitance generated between the first reference conductor and the power supply conductor.

8. The circuit board according to claim 5, wherein
   the signal conductor includes a first end portion, a second end portion, and a center point;
   the center point is located midway between the first end portion and the second end portion in a path of the signal conductor; and
   the first reference conductor is connected to the power supply conductor via the first capacitance at a point nearer to the first end portion than to the center point.

9. The circuit board according to claim 8, further comprising:
   a second reference conductor in the board body and connected to a reference potential, the second reference conductor being connected to the power supply conductor via a second capacitance and insulated from the signal conductor; wherein
   the second reference conductor is connected to the power supply conductor via the second capacitance at a point nearer to the second end portion than to the center point.

10. The circuit board according to claim 1, wherein the first reference conductor is connected to the power supply conductor via a first high pass filter.

11. The circuit board according to claim 10, wherein a pass band of the first high pass filter includes a frequency of the high frequency signal.

12. The circuit board according to claim 10, wherein
    the signal conductor includes a first end portion, a second end portion, and a center point;

the center point is located midway between the first end portion and the second end portion in a path of the signal conductor; and the first reference conductor is connected to the power supply conductor via the first high pass filter at a point nearer to the first end portion than to the center point.

13. The circuit board according to claim 12, further comprising:

a second reference conductor in the board body and connected to a reference potential, the second reference conductor being connected to the power supply conductor via a second high pass filter and insulated from the signal conductor; wherein the second reference conductor is connected to the power supply conductor via the second high pass filter at a point nearer to the second end portion than to the center point.

14. The circuit board according to claim 1, wherein the power supply conductor overlaps with at least a portion of the signal conductor as viewed in a stacking direction of the board body.

15. An electronic device comprising:

the circuit board according to claim 1; wherein the first reference conductor is connected to a reference potential of the circuit board.

16. The electronic device according to claim 15, wherein the signal conductor includes a first end portion and a second end portion; and the circuit board further includes:

a first signal electrode to connect to an external circuit and connected to the first end portion of the signal conductor; and a first reference electrode to connect to an external circuit and connected to the first reference conductor.

17. The electronic device according to claim 16, wherein the second end portion of the signal conductor is connected to an antenna to transmit and/or receive the high frequency signal.

18. The electronic device according to claim 16, further comprising a second signal electrode to connect to an external circuit and connected to the second end portion of the signal conductor.

19. The electronic device according to claim 15, wherein the first reference conductor is connected to the power supply conductor via a first capacitance.

20. The electronic device according to claim 19, further comprising a first chip capacitor defining the first capacitance.

* * * * *